United States Patent
Ko

(10) Patent No.: US 7,687,363 B2
(45) Date of Patent: Mar. 30, 2010

(54) METHOD FOR MANUFACTURING SEMICONDUCTOR DEVICE

(75) Inventor: Choul Joo Ko, Seongnam-si (KR)

(73) Assignee: Dongbu Electronics Co., Ltd., Seoul (KR)

(*) Notice: Subject to any disclaimer, the term of this patent is extended or adjusted under 35 U.S.C. 154(b) by 526 days.

(21) Appl. No.: 11/639,928

(22) Filed: Dec. 15, 2006

(65) Prior Publication Data

US 2007/0148844 A1    Jun. 28, 2007

(30) Foreign Application Priority Data

Dec. 28, 2005    (KR)    .................. 10-2005-0132333

(51) Int. Cl.
*H01L 21/336* (2006.01)
(52) U.S. Cl. .................. 438/298; 438/305; 257/E21.63
(58) Field of Classification Search .................. 438/298, 438/305, 529; 257/E21.63
See application file for complete search history.

(56) References Cited

U.S. PATENT DOCUMENTS

| 6,010,926 | A | * | 1/2000 | Rho et al. .................. 438/199 |
| 7,112,837 | B2 | | 9/2006 | Hsu et al. |
| 2005/0151207 | A1 | | 7/2005 | Moscatelli et al. |
| 2005/0205926 | A1 | * | 9/2005 | Chen et al. .................. 438/307 |

FOREIGN PATENT DOCUMENTS

KR    10-2005-0101616 A    10/2005

OTHER PUBLICATIONS

Ki Ju Baek; "Method of Manufacturing Power MOSFET Using Enhanced Arrangement of LDD Region for Reducing On-Resistance Without Degradation of Breakdown Voltage Characteristics"; Korean Patent Abstracts; Publication No. 1020050101616 A; Publication Date: Oct. 25, 2005; Korean Intellectual Property Office, Republic of Korea.
Korean Office Action dated Nov. 14, 2006; Korean Patent Application No. 10-2005-0132334; Korean Intellectual Property Office, Republic of Korea.

* cited by examiner

*Primary Examiner*—Chandra Chaudhari
(74) *Attorney, Agent, or Firm*—The Law Offices of Andrew D. Fortney; Andrew D. Fortney

(57) ABSTRACT

Disclosed is a method of manufacturing a semiconductor device, which includes the steps of: forming a high-voltage well region (e.g., by implanting impurity ions into a semiconductor substrate and then annealing); forming an isolation layer on the semiconductor substrate; implanting impurity ions into the high-voltage well region, thereby forming a low-voltage well region within the high-voltage well region; forming a gate electrode on the semiconductor substrate; and implanting impurity ions using the gate electrode as a mask, thereby forming source/drain regions within the low-voltage well region.

17 Claims, 3 Drawing Sheets

METHOD FOR MANUFACTURING SEMICONDUCTOR DEVICE

BACKGROUND OF THE INVENTION

1. Field of the Invention

The present invention relates to a method of manufacturing a semiconductor device, and more particularly, to a method of manufacturing a high-voltage semiconductor device.

2. Description of the Related Art

In general, semiconductor devices use a low power (e.g., of 3.3V or less) as supply power to reduce power consumption and to ensure reliability. However, such low power devices are generally connected to peripheral devices, which may receive a different power supply.

However, the peripheral devices often use a high voltage (e.g., of 5V or more) as supply power. Thus, many integrated circuits (IC's) include high-voltage transistors to allow a high input voltage to be supplied to the peripheral devices and/or circuits including the same from the outside.

Such a high-voltage transistor has the same structure as a normal (e.g., a low-voltage) transistor, and can be formed substantially simultaneously with the low-voltage transistor through a series of processes.

Recently, 15V bi-directional high-voltage devices have been integrated in a chip together with low-voltage devices. Such high-voltage devices can be used for output terminals of display data driver ICs in liquid crystal displays (LCDs) or organic luminescence electro displays (OLEDs).

Particularly, an exemplary number of output terminals of a display driver IC can be in a range of from 240 to 640. In addition, the uniformity of the output terminals directly exerts influences upon the uniformity of displayed images. For this reason, a uniform electrical characteristic of the output terminals is important.

Hereinafter, a method of manufacturing a high-voltage semiconductor device including a high-voltage transistor according to a related art will be described.

FIG. 1 is a sectional view of a high-voltage semiconductor device according to a related art.

As shown in FIG. 1, the high-voltage semiconductor device according to the related art includes a semiconductor substrate 1, a high-voltage p-well 2 formed on or in the semiconductor substrate 1, isolation layers 3 for defining an active region, a gate electrode 4 formed on a predetermined portion of the active region, source/drain regions 6 provided at opposite sides of the gate electrode 4, and drift regions 5 completely surrounding the source/drain regions 6 for the purpose of stability of a breakdown voltage.

At this time, since the isolation layer 3 may be obtained by forming a trench in the semiconductor substrate 1 and filling the trench with an insulating film, the thickness of the isolation layer 3 can be high relative to the depth of the source/drain regions 6 and/or the gate electrode 4.

According to the method of manufacturing a high-voltage semiconductor device, first, a predetermined portion of the semiconductor substrate 1 is masked and then impurities are implanted and diffused into the semiconductor substrate 1 through ion implantation and drive-in processes, thereby forming a high-voltage N-well (not shown) and a high voltage P-well 2 within the semiconductor substrate 1. At this time, since the drive-in process is performed at 1150° C. for 600 minutes, the depths of the high-voltage N-well and P-well become deep.

Thereafter, a mask for exposing a device isolating region is formed on the semiconductor substrate 1, and then trenches are formed by etching regions of the semiconductor substrate 1 exposed between the masks. After that, an insulating film deposited to fill the trenches. Subsequently, trench-type isolation layers 3 are formed by performing the chemical mechanical polishing (CMP) process with respect to the insulating film. Alternatively, isolation layers 3 may be formed by performing a conventional local oxidation of silicon (LOCOS) process.

Next, an N-drift region 5 and a P-drift region (not shown) are respectively formed on surfaces of the high-voltage P-well 2 and the high-voltage N-well through ion implantation of impurities. At this time, the N-drift region 5 and the P-drift region, which are low voltage N-well and P-well regions, respectively, use conventional masks applied to the conventional CMOS process.

At this time, a drift region is formed by implanting ions at an energy of 900 KeV in a 0.35 μm semiconductor process which forms gate electrodes having a CD (Critical Dimension) of about 0.35 μm. However, the drift region may be formed by implanting ions at an energy of 500 KeV in a 0.25 μm semiconductor process which forms gate electrodes having a CD of about 0.25 μm.

That is, if impurity ions are implanted at an energy of 500 KeV or more in the process of forming a 0.25 μm semiconductor device (that may be considered a highly integrated device), a large and deep impurity region is formed below a gate electrode with a short CD. Thus, a drift region in the 0.25 μm semiconductor process has a depth shallower than that in the 0.35 μm semiconductor process.

Next, gate oxide and polysilicon layers are deposited on the semiconductor substrate 1 and then simultaneously patterned, thereby forming a gate electrode 4.

In addition, source/drain regions 6 are formed at opposite sides of the gate electrode 4 of a high-voltage NMOS or PMOS transistor, respectively, through an ion implantation process. Thereafter, a series of subsequent processes including contact and wiring processes are performed.

However, the aforementioned method of manufacturing a high-voltage device has the following problem.

That is, when forming a low-voltage well (a drift region), a maximum energy for ion implantation may be 900 KeV in a 0.35 μm semiconductor process, while a maximum energy for ion implantation may be 500 KeV in a 0.25 μm semiconductor process. For this reason, the bonding depth of a low-voltage well is shallower in the 0.25 μm semiconductor process than in the 0.35 μm semiconductor process.

Accordingly, if such a structure is implemented in the 0.25 μm semiconductor process, the electric field at an edge portion of a gate electrode of a device is not sufficiently covered so that surface breakdown may occur.

SUMMARY OF THE INVENTION

It is, therefore, an object of the present invention to provide a method of manufacturing a semiconductor device, wherein the depth and concentration of a high-voltage well region are adjusted so that surface breakdown can be prevented from occurring at an edge portion of a gate electrode due to a low-voltage well region having a shallow depth.

In accordance with a preferred embodiment of the present invention, there is provided a method of manufacturing a semiconductor device, which includes the steps of: forming a high-voltage well region; forming an isolation layer on the semiconductor substrate; implanting impurity ions into the high-voltage well region, thereby forming a low-voltage well region within the high-voltage well region; forming a gate electrode on the semiconductor substrate; and implanting impurity ions using the gate electrode as a mask, thereby forming source/drain regions within the low-voltage well region.

DETAILED DESCRIPTION OF THE INVENTION

Hereinafter, a method of manufacturing a semiconductor device according to the present invention will be described with reference to the accompanying drawings.

FIGS. 2 to 5 are sectional views illustrating a method of manufacturing a semiconductor device according to the present invention. Particularly, the semiconductor device according to the present invention may be applied to a high-voltage field.

Figure 1:
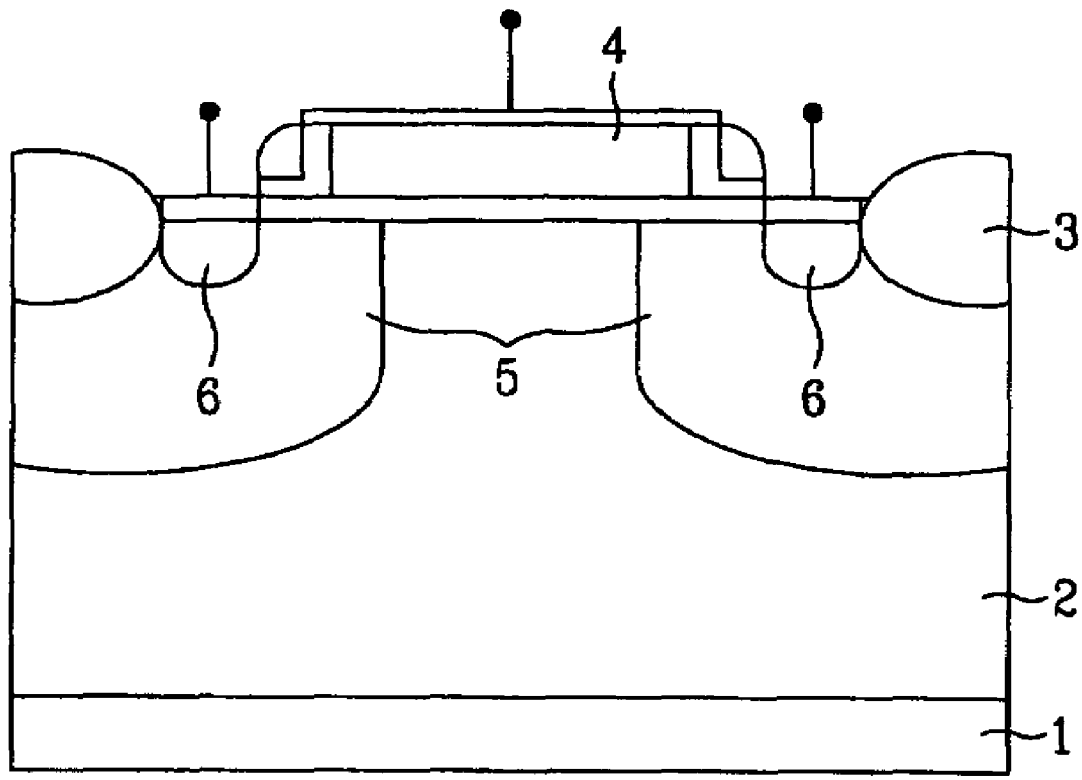
FIG. 1 is a sectional view of a high-voltage semiconductor device according to a related art.
Figure 2:
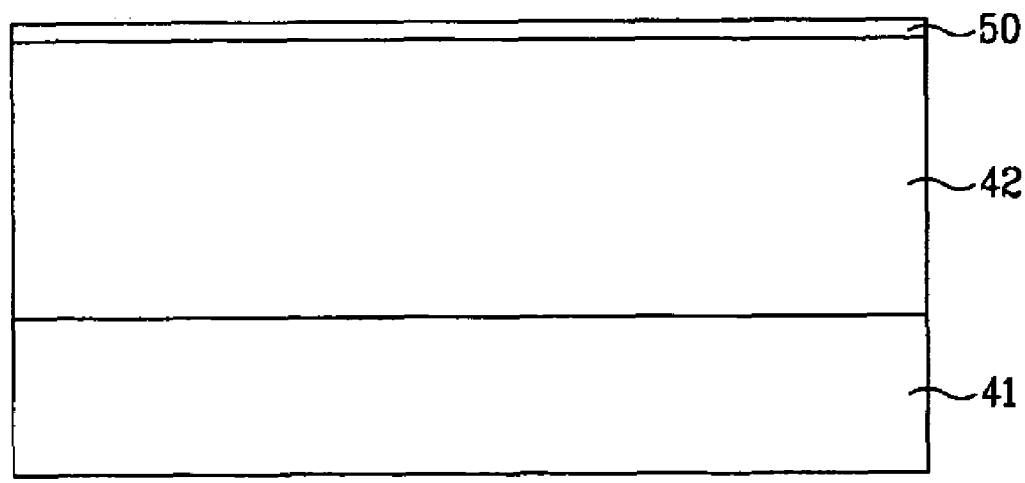
FIGS. 2 to 5 are sectional views illustrating a method of manufacturing a semiconductor device according to the present invention.

Referring to FIG. 2, a buffer oxide film 50 is formed on a semiconductor substrate 41, and an ion implantation process using a first well-mask (not shown) is performed.

The ion implantation process may include three ion implantation steps. For example, forming the high-voltage well may comprise a first ion implantation at a high dopant concentration and at a low energy, a second ion implantation at a medium energy, and a third ion implantation at a high energy. Here, the amount of dopant implanted at low energy may have a low concentration in a case where a relatively high amount of dopant is implanted into the low-voltage well region.

Specifically, the ion implantation energy relates to Rp (projection range) when implanting ions. Therefore, if ions are implanted under high energy of about 900 keV, dopants are implanted deeply. For example, in a case where ions are implanted at an energy of 200 keV (medium energy), dopants may be implanted to a depth of up to Rp=1.02 μm. In this case, a low (or lower) energy may be approximately 100 keV or less.

Further, a current or density may relate to an amount of ions implanted during the ion implantation process. Ions of $5 \times 10^{12}/cm^2$ may be implanted in a case of a high current, high density or high amount, and ions of $3 \times 10^{12}/cm^2$ may be implanted in a case of a medium current, medium density or medium amount.

Thereafter, a high-voltage well region 42 such as high-voltage P-well and N-well is formed within the semiconductor substrate 41 by annealing the ion-implanted impurities through an RTP (Rapid Thermal Process) or the like.

Since impurity ion implantations may be performed at low, medium and high energy in the high-voltage well region 42, impurities are doped to different depths depending on the energy (or a difference of energy) used in the ion implantation. That is, although the high-voltage well region 42 having impurities implanted therein is not shown in FIG. 2, different dopant doses may also be implanted at different depths, respectively.

Accordingly, the high-voltage well region 42 according to the present invention may include a first ion implantation process (at a low energy, or to a relatively shallow depth), a second ion implantation process (medium energy, or to a medium depth) and a third ion implantation process (high energy, or to a relatively great depth). In the first ion implantation process, the amount of dopant implanted may be selected considering the doping concentration of a low-voltage well region to be described later.

Figure 3:
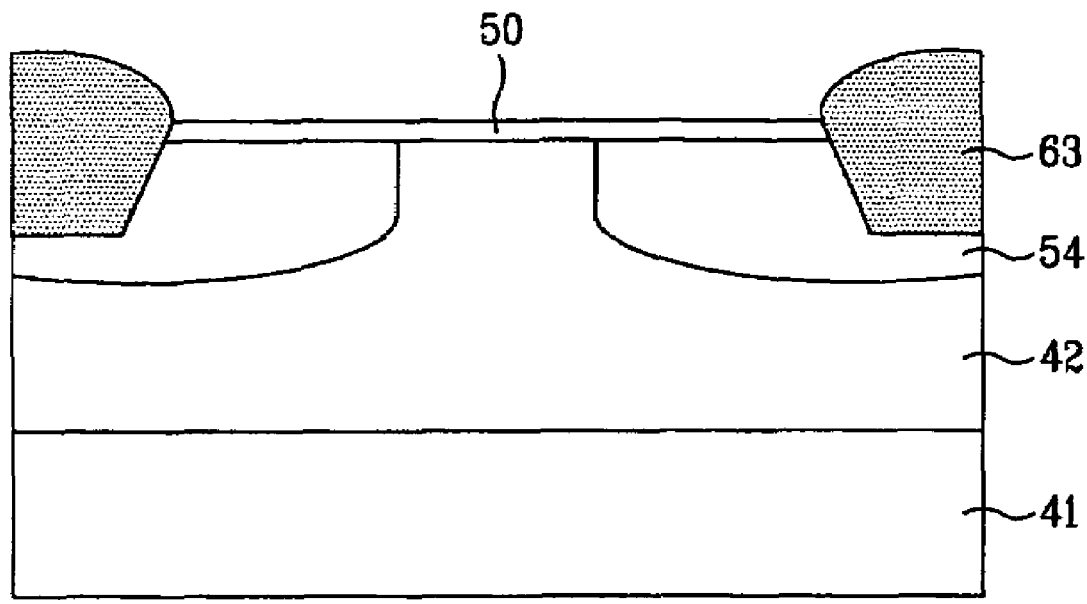

Referring to FIG. 3, a pad nitride film (not shown) is deposited on the semiconductor substrate 41, and the pad nitride film and the buffer oxide film 50 are patterned through a known photolithography process such that a device isolation region of the substrate is exposed. Subsequently, trenches are formed by etching the exposed regions of the semiconductor substrate 41, and an insulating film is then deposited therein such that the trenches are filled with the insulating film.

Subsequently, trench-type isolation layers 63 are formed by chemical mechanical polishing (CMP) the insulating film until a predetermined thickness thereof remains on the pad nitride film (or until the nitride film is exposed), and the pad nitride film is removed through an etching process.

Next, an impurity ion implantation process is performed on the semiconductor substrate 41 using a second well-mask (not shown), and low-voltage well regions 54 are formed in the interior of the high-voltage well region 42 by performing an annealing process.

At this time, in a case of a process for forming 0.25 μm highly integrated semiconductor devices, ions are implanted at an energy of about 500 KeV in an ion implantation process for forming a high-voltage well region. For this reason, a low-voltage well region is formed at a relatively shallow depth, in comparison to the high-voltage well region 42.

Since the depth and concentration of a high-voltage well region can be adjusted as much as possible through only ion implantation and annealing processes, although the (bonding) depth of a low-voltage well region is shallow and the concentration thereof relative to the high-voltage well in which it is implanted is high, a breakdown voltage can be increased by 20V or more. That is, since a dose can be adjusted as much as possible in a case of a high-voltage well region, the breakdown voltage of a low-voltage well region can be adjusted to exceed 20V.

For example, if a portion with a high doping concentration in a low-voltage well region has a depth of 1 μm or so, the doping concentration of a high-voltage well region with the depth is lowered such that a high electric field does not concentrate on the portion. Further, this is similar to a case where the doping concentration of an N-doped region is lowered to raise a breakdown voltage if the doping concentration is high.

As described above, the ion implantation process for forming a high-voltage well region may be performed three times. Ion implantation must be implanted with a low current so as to lower a doping concentration in the ion implantation performed under low energy among these ion implantations.

For reference, in a case where the high-voltage well region is a high-voltage P-well, a low-voltage N-well is formed on a surface of the high-voltage P-well region, and in a case where the high-voltage well region is a high-voltage N-well, a low-voltage P-well is formed on a surface of the high-voltage N-well region.

Figure 4:
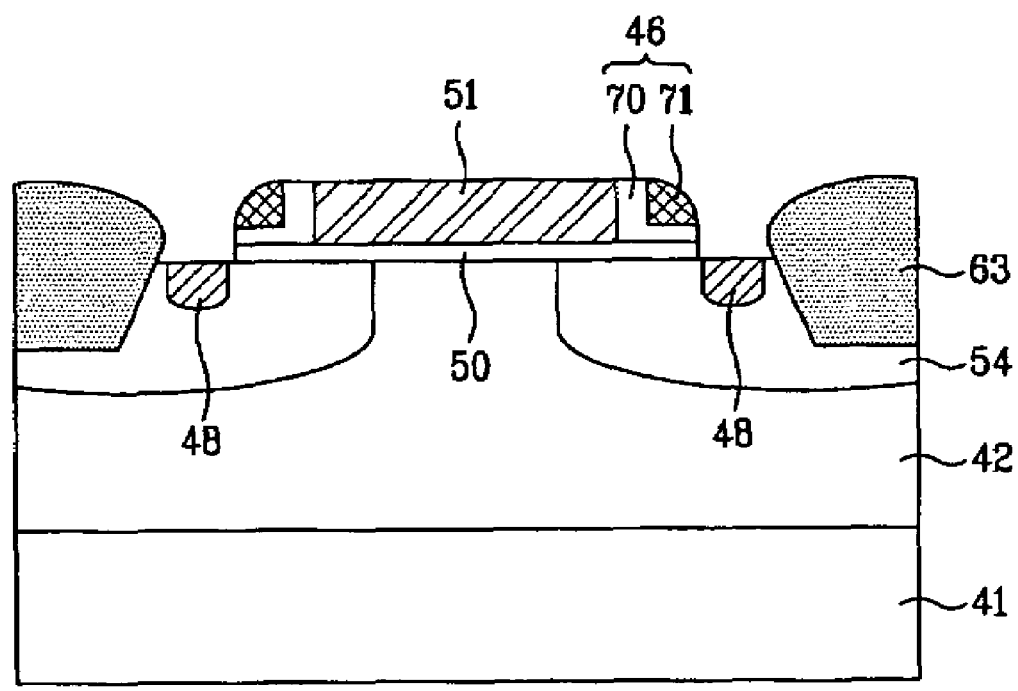

Referring to FIG. 4, polysilicon, an oxide film 70 (e.g., $SiO_2$) and a nitride film 71 are deposited on the buffer oxide film 50, and sidewall spacers 46 are respectively formed on sidewalls of the gate electrode 51 by anisotropically etching the nitride film 71 and the oxide film 70.

Thereafter, impurities are ion implanted at a high concentration or dose using the gate electrode 51 and the sidewall spacers 46 as a mask, thereby forming source/drain regions 48 on surfaces of the semiconductor substrate 41 at opposite sides of the gate electrode 51.

Figure 5:
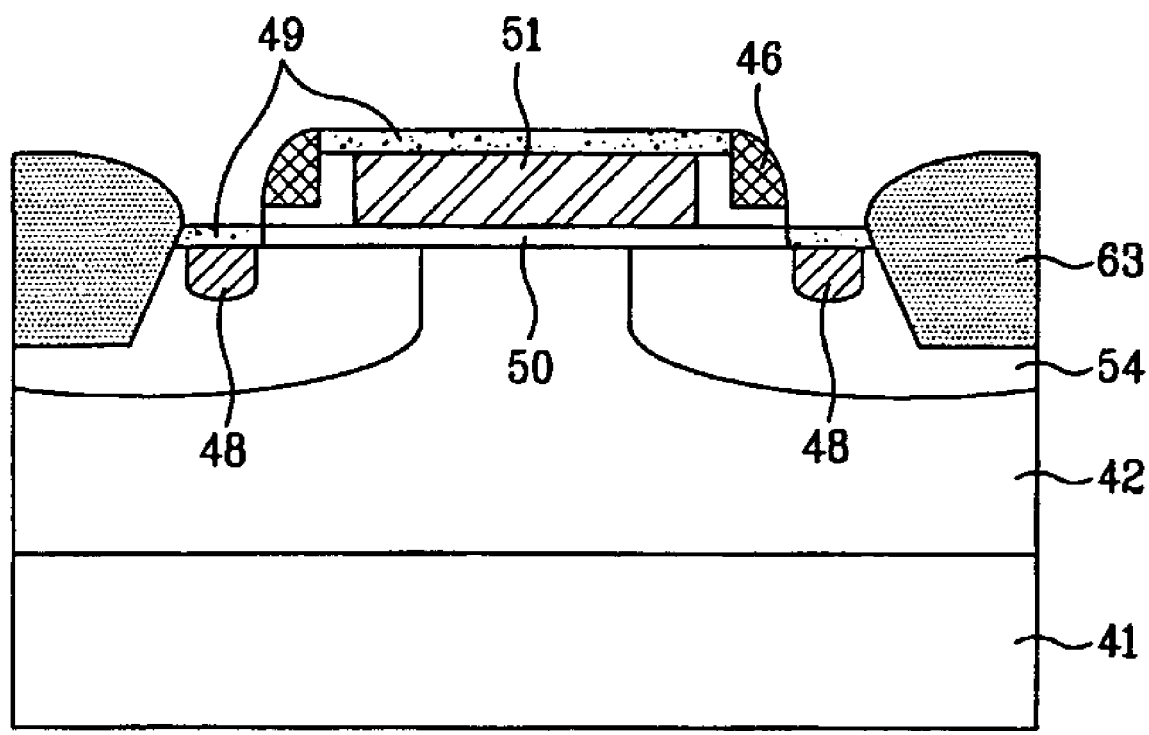

Referring to FIG. 5, silicide 49 are formed on surfaces of the gate electrode 51 and the source/drain regions 48 through a silicide or salicide process, thereby completing a high-voltage transistor according to the present invention.

Thereafter, although not shown in these figures, a series of subsequent processes including contact plug and metal wiring processes are performed.

A semiconductor device manufactured according to the present invention includes a semiconductor substrate 41 having a high-voltage well region 42 (e.g., a high-voltage P-well and separately, a high-voltage N-well); an isolation layer 63 that defines an active region of the semiconductor substrate 41; a low-voltage well region 54 of low-voltage P-well and N-well; a gate electrode 51 formed at a predetermined portion within the active region; and source/drain regions respectively formed in the low-voltage well regions at both sides of the gate electrode 51.

Preferably, the high-voltage P-well and N-well are formed through only an ion implantation and annealing process without a drive-in process.

At this time, the low-voltage P-well and N-well become P-type and N-type drift regions, respectively.

Further, in a case where the CD (Critical Dimension) of the gate electrode is 0.25 μm, impurities are ion implanted at a maximum energy of 500 KeV when forming the low-voltage P-well and N-well. For this reason, the bonding depth of a low-voltage well is shallower than 0.35 μm.

What is claimed is:

1. A method of manufacturing a semiconductor device, the method comprising the steps of:
    forming a buffer oxide film on a semiconductor substrate;
    forming a high-voltage well region in the semiconductor substrate by performing a first ion implantation at a relatively low energy, a second ion implantation at a medium energy, and a third ion implantation at a relatively high energy;
    forming a pad nitride film on the buffer oxide film;
    patterning the pad nitride film and the buffer oxide film and forming an isolation layer on the semiconductor substrate;
    removing the patterned pad nitride film;
    implanting first dopants into the high-voltage well region, thereby forming a low-voltage well region within the high-voltage well region;
    forming a gate electrode on the semiconductor substrate; and
    implanting second dopants into the low-voltage well region using the gate electrode as a mask, thereby forming source/drain regions within the low-voltage well region.

2. The method of claim 1, wherein forming the high-voltage well region comprises a plurality of ion implantation processes at different energies.

3. The method of claim 2, wherein the first ion implantation is performed at an energy of about 120 keV, the second ion implantation process is performed at an energy of about 200 keV and the third implantation process is performed at an energy of about 900 keV.

4. The method of claim 1, wherein the first, second and third ion implantation processes are performed with different amounts of dopants.

5. The method of claim 4, wherein the amount of dopant in the first ion implantation process is less than the amount of dopant implanted into the low-voltage well region.

6. The method of claim 1, wherein forming the high-voltage well region further comprises annealing the substrate after performing the first, second and third ion implantations.

7. The method of claim 6, wherein the annealing process includes an RTP (Rapid Thermal Process).

8. The method of claim 1, wherein a CD (Critical Dimension) of the gate electrode is 0.25 μm or less.

9. The method of claim 1, wherein the high-voltage well region is a high-voltage P-well, and the low-voltage well region is a low-voltage N-well.

10. The method of claim 1, wherein the high-voltage well region is a high-voltage N-well, and the low-voltage well region is a low-voltage P-well.

11. The method of claim 1, wherein the first ion implantation is performed at a relatively high dopant concentration and third ion implantation is performed at a relatively low dopant concentration.

12. The method of claim 4, wherein a dosage of the first ion implantation is approximately $5 \times 10^{12}/cm^2$.

13. The method of claim 4, wherein a dosage of the second ion implantation is approximately $3 \times 10^{12}/cm^2$.

14. The method of claim 13, wherein the low-voltage region has a relatively shallow depth with respect to the high-voltage well region.

15. The method of claim 1, wherein forming the isolation layer comprises forming a trench in exposed regions of the semiconductor substrate.

16. The method of claim 15, further comprising depositing an insulating film into the trench.

17. The method of claim 12, wherein a breakdown voltage of the low-voltage well region exceeds 20 V.

* * * * *